(12) United States Patent
Rotem et al.

(10) Patent No.: US 9,500,714 B2
(45) Date of Patent: Nov. 22, 2016

(54) POWER CONSUMPTION MONITORING DEVICE FOR A POWER SOURCE

(71) Applicant: Intel Corporation, Santa Clara, CA (US)

(72) Inventors: Efraim Rotem, Haifa (IL); Nir Rosenzweig, Givat Ella (IL); Jeffrey A. Carlson, Hillsboro, OR (US); Philip R. Lehwalder, Hillsboro, OR (US); Nadav Shulman, Tel Mond (IL); Doron Rajwan, Rishon Le-Zion (IL)

(73) Assignee: INTEL CORPORATION, Santa Clara, CA (US)

( * ) Notice: Subject to any disclaimer, the term of this patent is extended or adjusted under 35 U.S.C. 154(b) by 266 days.

(21) Appl. No.: 14/040,346

(22) Filed: Sep. 27, 2013

(65) Prior Publication Data

US 2015/0091550 A1 Apr. 2, 2015

(51) Int. Cl.
*G01R 19/252* (2006.01)
*G01R 31/36* (2006.01)
*G01R 21/133* (2006.01)
*G01R 22/10* (2006.01)

(52) U.S. Cl.
CPC ......... *G01R 31/3648* (2013.01); *G01R 21/133* (2013.01); *G01R 22/10* (2013.01)

(58) Field of Classification Search
CPC ... H03L 7/0995; H03L 7/0812; H03L 7/085; H03L 7/0891; H03L 7/107; G01R 15/146; G01R 19/2513; G01R 21/06; G01R 31/3624; G01R 31/3662; G01R 31/3679; G01R 21/133; G01R 22/10; G01R 27/28; G01R 31/2824; G01R 31/3648; G01R 31/02; H02J 17/00; H02J 5/005
See application file for complete search history.

(56) References Cited

U.S. PATENT DOCUMENTS

| | | | | |
|---|---|---|---|---|
| 4,345,311 A * | 8/1982 | Fielden | ........................... | 702/62 |
| 8,275,562 B2 * | 9/2012 | Su | ...................... | G01R 31/3606 |
| | | | | 320/163 |
| 2001/0026174 A1* | 10/2001 | Delano | .......................... | 327/91 |

* cited by examiner

*Primary Examiner* — Vinh Nguyen

(57) ABSTRACT

Examples are disclosed for an integrated circuit (IC) device coupled to a battery-operated power supply unit, such as an IC in a mobile computing device or wireless phone, to accurately determine energy usage drawn from the power supply unit under rapidly dynamic circumstances. A current sense signal of a power line from the power supply unit is digitized. The digitized current sense is added to an accumulator at a rate that is approximately proportional to a voltage of the power line from the power supply unit. The accumulator is then outputted and scaled to units relevant to energy measurements. The energy measurement is used to estimate remaining battery life. Triggering the digitization of the current sense signal may be by use of a pulse generation circuit, or by use of an overflow indicator of an accumulator for a digitized voltage sense signal.

21 Claims, 6 Drawing Sheets

100

200

300

400

POWER CONSUMPTION MONITORING DEVICE FOR A POWER SOURCE

TECHNICAL FIELD

Examples described herein are generally related to monitoring energy produced by a power source.

BACKGROUND

A power supply unit for an integrated circuit (IC) typically includes a battery and a voltage regulator. Voltage regulators may be used to condition the supplied voltage and to indicate status of the power supply unit. Voltage and status may change as the power drawn by a load (e.g., the IC) changes. Known voltage regulators provide status by measuring voltage and current produced by the power supply unit, but are unable to provide a direct measurement of power. Power would have to be calculated by use of a high-speed analog multiplier, which is costly at least in terms of processing resources. Known voltage regulators, which estimate average power by multiplying an average current measurement by an average voltage measurement, produce large error in the calculated average power. Also, the power drawn by the IC may change extremely rapidly, on the order of the clock speed of the IC, and slow sampling speeds of the known voltage regulators are unable to capture the effects of these rapid changes. The combined effect of these sources of error is uncertainty in the amount of power that a power supply has supplied. Therefore, a need exists to provide more accurate monitoring of energy drawn from a power supply.

DETAILED DESCRIPTION

In the following description, numerous specific details are set forth in order to provide a thorough understanding of various embodiments. However, various embodiments may be practiced without the specific details. In other instances, well-known methods, procedures, components, and circuits have not been described in detail so as not to obscure the particular embodiments. Further, various aspects of embodiments may be performed using various means, such as integrated semiconductor circuits ("hardware"), computer-readable instructions organized into one or more programs ("software"), or some combination of hardware and software. For the purposes of this disclosure reference to "logic" shall mean either hardware, software, or some combination thereof.

As integrated circuit ("IC") fabrication technology improves, manufacturers are able to integrate additional functionality onto a single silicon substrate. As the number of these functionalities increases, however, so does the number of components on a single IC chip. Additional components add additional signal switching that, in turn, consumes more energy. The additional energy consumption may produce unwanted heat and thermal expansion, and may drain a battery more quickly. A portable computing device may solely rely on battery power for its operations. Hence, the need to monitor power consumption becomes increasingly important, for example, to maintain battery power for an extended period of time and/or warn a user, e.g., to plug in, to recharge the battery, to change the battery, etc.

Some of the embodiments discussed herein may provide efficient and flexible monitoring of energy delivery from a power source to computing systems and/or processors (including general purpose processors, graphics processors, systems on silicon, systems on chip (SoC), etc.). In an embodiment, energy delivered by a power supply unit may be monitored over flexible time intervals, e.g., with adjustable time intervals. More particularly, computer systems generally have power usage that rapidly fluctuates over periods of time comparable to the processor clock speed, as various operations are performed or various portions of circuitry are activated or deactivated. For example, a processor may enter a sleep mode or a turbo mode; chip transceivers may be activated to communicate with other ICs; a radio interface may be activated to support wireless communications; graphics circuitry may be activated to render a rapidly changing display such as streaming video; and so forth. In many ICs, the processor package (processor, GT (Graphics), memory controller, etc.) and/or its surrounding components (e.g., Double Data Rate (DDR) memory, Peripheral Control Hub (PCH), etc.) are the dominant power consumers in the system, and fluctuations in their power needs are dominant. Power units need to be designed for fluctuating power needs, which in turn impacts battery life between recharges or replacement.

Figure 1:
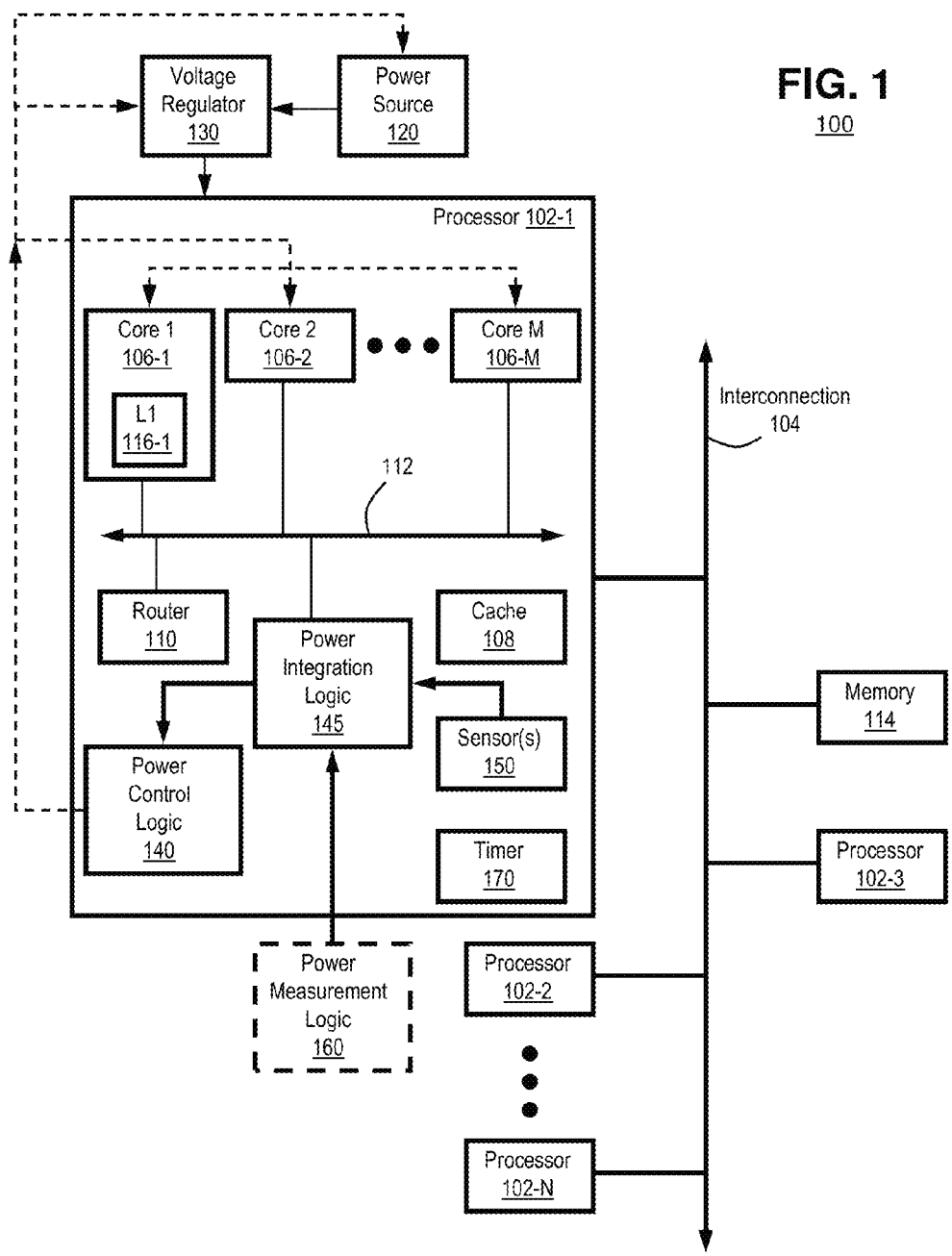
FIG. 1 illustrates an example of a system.

FIG. 1 illustrates a block diagram of a computing system 100, according to one embodiment. The system 100 may include one or more processors 102-1 through 102-N (generally referred to herein as "processors 102" or "processor 102"), in which N is an integer, N≥1. The processors 102 may communicate via an interconnection or bus 104. Each processor may include various components some of which are only discussed with reference to processor 102-1 for clarity. Accordingly, each of the remaining processors 102-2 through 102-N may include the same or similar components discussed with reference to the processor 102-1.

In an embodiment, the processor 102-1 may include one or more processor cores 106-1 through 106-M (referred to herein as "cores 106," or "core 106"), in which M is an integer, M≥1, a cache 108, and/or a router 110. The processor cores 106 may be implemented on a single integrated circuit (IC) chip. Moreover, the chip may include one or more shared and/or private caches (such as cache 108), buses or interconnections (such as a bus or interconnection 112), graphics and/or memory controllers, or other components.

In one embodiment, the router 110 may be used to communicate between various components of the processor 102-1 and/or system 100. Moreover, the processor 102-1 may include more than one router 110. Furthermore, the multitude of routers 110 may be in communication to enable data routing between various components inside or outside of the processor 102-1.

The cache 108 may store data (e.g., including instructions) that are utilized by one or more components of the processor 102-1, such as the cores 106. For example, the cache 108 may locally cache data stored in a memory 114 for faster access by the components of the processor 102 (e.g., faster access by cores 106). As shown in FIG. 1, the memory 114 may communicate with the processors 102 via the interconnection 104. In an embodiment, the cache 108 (that may be shared) may be a mid-level cache (MLC), a last level cache (LLC), etc. Also, each of the cores 106 may include a level 1 (L1) cache (116-1) (generally referred to herein as "L1 cache 116") or other levels of cache such as a level 2 (L2) cache. Moreover, various components of the processor 102-1 may communicate with the cache 108 directly, through a bus (e.g., the bus 112), and/or a memory controller or hub.

The system 100 may also include a power source 120 (e.g., a direct current (DC) power source or an alternating current (AC) power source) to provide power to one or more components of the system 100. In some embodiments, the power source 120 may include one or more battery packs and/or power supplies. The power source 120 may be coupled to components of system 100 through a voltage regulator (VR) 130. Moreover, even though FIG. 1 illustrates one power source 120 and one voltage regulator 130, additional power sources and/or voltage regulators may be utilized. For example, each of the processors 102 may have corresponding voltage regulator(s) and/or power source(s). Also, the voltage regulator(s) 130 may be coupled to the processor 102 via a single power plane (e.g., supplying power to all the cores 106) or multiple power planes (e.g., where each power plane may supply power to a different core or group of cores).

Additionally, while FIG. 1 illustrates the power source 120 and the voltage regulator 130 as separate components, the power source 120 and the voltage regulator 130 may be incorporated into other components of system 100. For example, all or portions of the VR 130 may be incorporated into the power source 120 and/or processor 102.

As shown in FIG. 1, the processor 102 may further include a power control logic 140 to control supply of power to components of the processor 102 (e.g., cores 106). While the embodiments are not limited in this respect, in various embodiments, at least a portion of the logic 140 and other logic described elsewhere herein is implemented in hardware. Logic 140 may have access to one or more storage devices discussed herein (such as cache 108, L1 cache 116, memory 114, or another memory in system 100) to store information relating to operations of logic 140 such as information communicated with various components of system 100 as discussed here.

As shown in FIG. 1, the logic 140 may be coupled to the VR 130 and/or other components of system 100 such as the cores 106 and/or the power source 120. For example, the logic 140 may be coupled to receive information (e.g., in the form of one or more bits or signals) to indicate status of one or more sensors 150. Sensors 150 may be provided proximate to components of system 100, such as the cores 106, interconnections 104 or 112, etc., in order to sense variations in various factors affecting power/thermal behavior of the system, such as temperature, operating frequency, operating voltage, power consumption, inter-core communication activity, and so forth.

Logic 140 may also be coupled to receive information to indicate status of a power integration logic 145. Integration logic 145 may indicate operational status of various components of system 100, such as architectural events and power estimation(s) corresponding to cores 106. Status may be provided to logic 145 by the cores 106 directly, or via interconnection 112).

In an embodiment, variations may be sensed in such a way to account for leakage versus active power. The logic 140 may in turn instruct the VR 130, power source 120, and/or individual components of system 100 (such as the cores 106) to modify their operations. For example, logic 140 may indicate to the VR 130 and/or power source 120 to adjust their output. In some embodiments, logic 140 may request the cores 106 to modify their operating frequency, power consumption, etc.

Although components 140, 145, and 150 are shown as included in processor 102-1, these components may be provided elsewhere in the system 100. For example, power control logic 140 may be provided in the VR 130, in the power source 120, directly coupled to the interconnection 104, within one or more (or alternatively all) of the processors 102, etc. Furthermore, as shown in FIG. 1, the power source 120 and/or the voltage regulator 130 may communicate with the power control logic 140 and report their power specification.

As shown in FIG. 1, the system 100 may include a power measurement logic 160, which may be provided inside the processor or external to the processor 102 (such as shown). In an embodiment, the logic 160 may measure actual power consumption levels (e.g., based on current voltage and/or electrical current measurements) by one or more of cores 106 (or more generally the processor 102). In some embodiments, the measurement by the power measurement logic 160 may be performed by executing software or firmware. In another embodiment, the power measurement logic 160 may track architectural activity or state of the processor (e.g., to predict values in addition to or instead of actual measurements). In an embodiment, logic 160 may be coupled to the VR 130 and/or power source 120 to measure actual current or power consumption by the processor 102. In another embodiment, the power measurement logic 160 may be integrated into the VR 130 and/or power source 120.

Embodiments in accordance with the present disclosure perform voltage and current measurements, and provide an accurate measurement of energy usage without the use of expensive multipliers within the VR or elsewhere within other remote sensors or power sources. The energy usage may be measured while the VR is running and supplying a dynamic load (e.g., a load in which the current and/or voltage drawn from the power supply unit may be varying).

Embodiments sample the voltage at a fixed rate. In turn, the current may be sampled at a rate that is approximately proportional to the sampled voltage. Together, this has the effect of sampling the current more frequently when the power is drawn, thus generating a more accurate energy measurement.

It should be appreciated that the exemplary system 1000 shown in the block diagram of FIG. 1 may represent one functionally descriptive example of many potential implementations. Accordingly, division, omission or inclusion of block functions depicted in the accompanying figures does not infer that the hardware components, circuits, software and/or elements for implementing these functions would be necessarily be divided, omitted, or included in embodiments.

Figure 2:
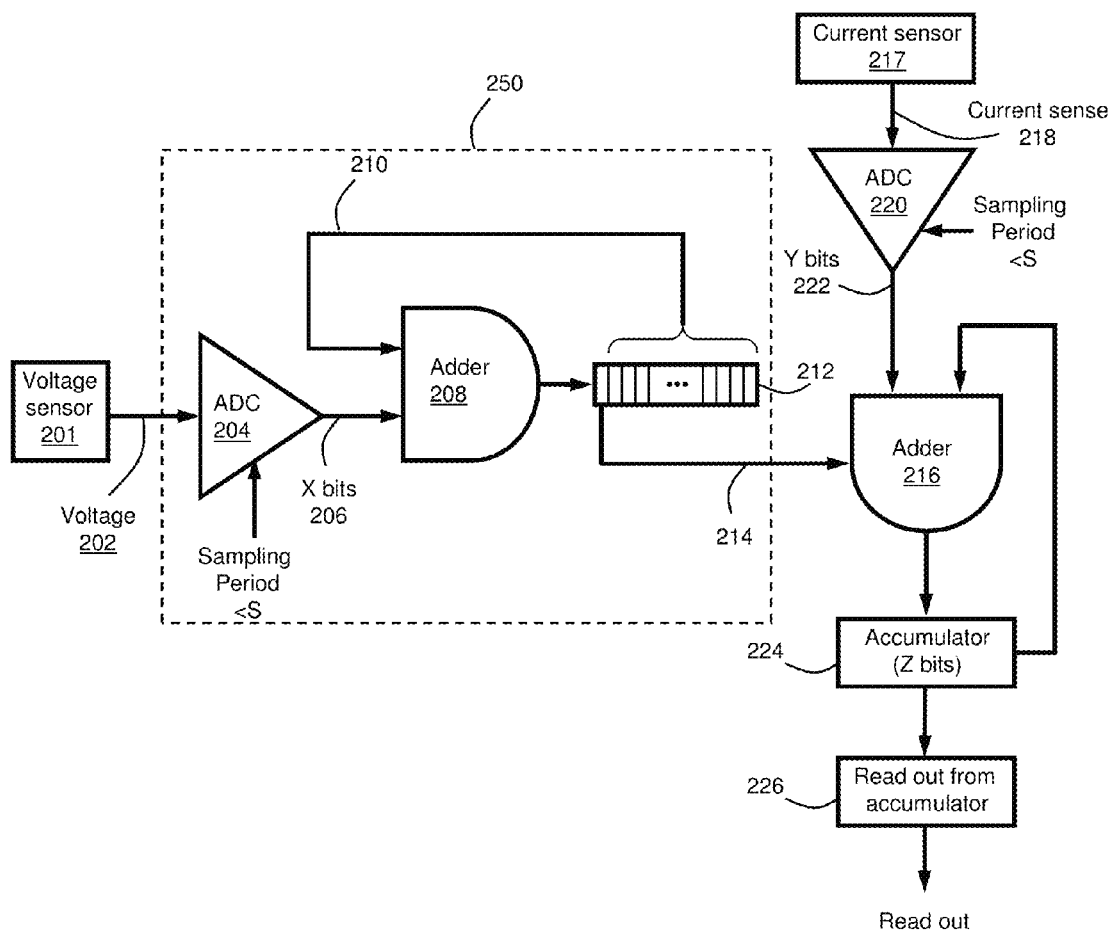
FIG. 2 illustrates an example of a first energy measurement circuit.

FIG. 2 illustrates at a high level of abstraction a block diagram of a circuit 200 in accordance with an embodiment of the present disclosure. Circuit 200 includes a sensing input for voltage 202 that is to be sampled. Voltage 202 is a voltage provided from voltage sensor 201, such as a high-impedance voltage tap. Voltage 202 may be provided to analog-to-digital converter ("ADC") 204, which may be digitized at a fixed sampling period "S" to produce an X-bit digital word 206. The sampling period S is related to a sampling rate "R" by $S=1/R$. In an embodiment, the sampling rate normally may be 1.0 MHz, the sampling period may be 1.0 microsecond, and digital word 206 may be a 10-bit digital word. However, the sampling rate may be configurable and/or adaptive to changes in the actual or expected energy drawn from the power supply unit. For example, the sampling period may be on the order of nanoseconds for a computationally active computing system. In some embodiments, the sampling rate may be configurable to about 1.0 GHz to about 5.0 GHz. In some embodiments, the sampling period may be configurable to be fixed multiple of a processing clock period. Conversely, the sampling period may be on the order of seconds for a processing circuit of a computing system in sleep mode, hibernation, or the like.

The X-bit digital word 206 from ADC 204 may be provided as a first input to adder 208. A second input 210 to adder 208 may be supplied as feedback from the lower X bits of accumulator 212. Accumulator 212 may be an X-bit (plus carry bit) storage register that stores the result of the summation operation of adder 208. Adder 208 and accumulator 212 together function as a modulo $2^X$ summation of the samples of voltage 202 that have been digitized at a sampling period S.

Accumulator 212 includes a carry bit 214. Carry bit 214 goes high when the result of adder 208 overflows the X-bit representation of accumulator 212. Carry bit 214 may be reset low upon the next sampling period of adder 208, unless the sum produced by adder 208 again overflows the X-bit representation of accumulator 212. Carry bit 214 may be provided as an enable signal to adder 216.

Adder 216 operates at irregular intervals since it is enabled by carry bit 214 from accumulator 212. Each time adder 216 is enabled for a measurement, time information may be recorded. Time information may include the time at which the measurement had been taken is noted, or a time difference between successive measurements. A first input to adder 216 may be derived from current sense 218. A second input to adder 216 may be taken as feedback from accumulator 224 as discussed below.

Current sense 218 is a voltage provided by current sensor 217. Current sensor 217 may sense the current produced by the VR of the power supply unit, and corresponds to the voltage 202 produced by the VR of the power supply unit. Current sense 218 ordinarily may be an analog signal, which may be converted to a Y-bit digital word by ADC 220. In some embodiments, ADC 220 samples current sense 218 at a sampling period S that may be also be used as the sampling period by ADC 204.

In other embodiments, ADC 220 may be enabled by a different signal and/or at a different rate than that at which ADC 204 is enabled. For example, since the output of ADC 220 is used only when adder 216 is enabled by carry bit 214, ADC 220 may instead be enabled by carry bit 214, and a clock delay may be inserted between enabling ADC 220 and operation of adder 216. In some embodiments, adder 216 may be operated by a different clock and/or at a different rate than ADC 220.

ADC 220 produces a Y-bit binary representation 222 of the value of current sense 218. The Y-bit binary representation 222 may be provided as a first input to adder 216. Adder 216 adds the value of Y-bit binary representation 222 to accumulator 224. In some embodiments, accumulator 224 may be Z-bits wide, with Z≥Y. A second input to adder 216 may be taken as feedback from accumulator 224, so that the value of current sense 218 may be added to accumulator 224 upon each enablement of adder 216.

A circuit 226 interfaces with accumulator 224 in order to read and output the value of the accumulated current readings. In some embodiments, the value of accumulator 224 may be read out and used with each update of its value.

At a high level of abstraction, circuit 200 operates by accumulating current measurements at a frequency that increases approximately proportionally with voltage. To achieve this, voltage 202 may be sampled by ADC 204. The range of ADC 204 may be scaled to a maximum voltage range "V" expected for voltage 202, thus causing the resolution of ADC 204 to be $V/2^X$ volts. The value of ADC 204 may be added to X-bit accumulator 212 at a fixed frequency of R. Each overflow of accumulator 212, when averaged over time, indicates that the integration of the voltage over a plurality of sampling periods S, has reached a predetermined level, e.g., a voltage-time product V*T. Each time accumulator 212 overflows, a new Y-bit current measurement sample 222 may be added to Z-bit accumulator 224, thereby achieving a desired behavior between voltage and current.

The accumulated value of sampled current sense 218 may be read from accumulator 224. Accumulator 224 may overflow and wrap around between these reads, but as long as accumulator 224 overflows at most once between reads, and that the accumulated value after wrap-around is less than the accumulated value before wrap-around, there should be no ambiguity. Circuit 200 relies on the measuring a difference between reads of accumulator 224, not the absolute value of accumulator 224. From the values of current read from accumulator 224, and the approximate V*T product as indicated by the timing of the overflows of accumulator 212, an amount of energy (e.g., joules) may be calculated as I*V*T.

Faster sampling of voltage 202 and current sense 218 will produce accumulated values in accumulators 212 and 224 that better track changes (e.g., fast transient changes) in voltage 202 and current sense 218. Such faster sampling will thus provide a more accurate estimate of the energy (joules) that has been delivered by the power supply unit. Circuit 200 may be able to provide a fast calculation of the energy delivered and thus capture more fast transients and provide a fast update of the energy delivered. In contrast, sampling voltage 202 and current sense 218 and then calculating a direct multiplication of the sampled values would be a more time-consuming calculation, and would thereby limit the achievable sampling rate, and would thus miss capturing the energy associated with fast transients.

Accumulator 224 may be easily implemented as a low-area, and low-cost resource compared to a multiplier that would otherwise have to be added to a voltage regulator for the same level of functionality. Circuit 200 for monitoring energy consumption also allows for the calculation of power during any time interval by dividing the accumulated energy by time, with the interval being of the user's choice.

Figure 3:
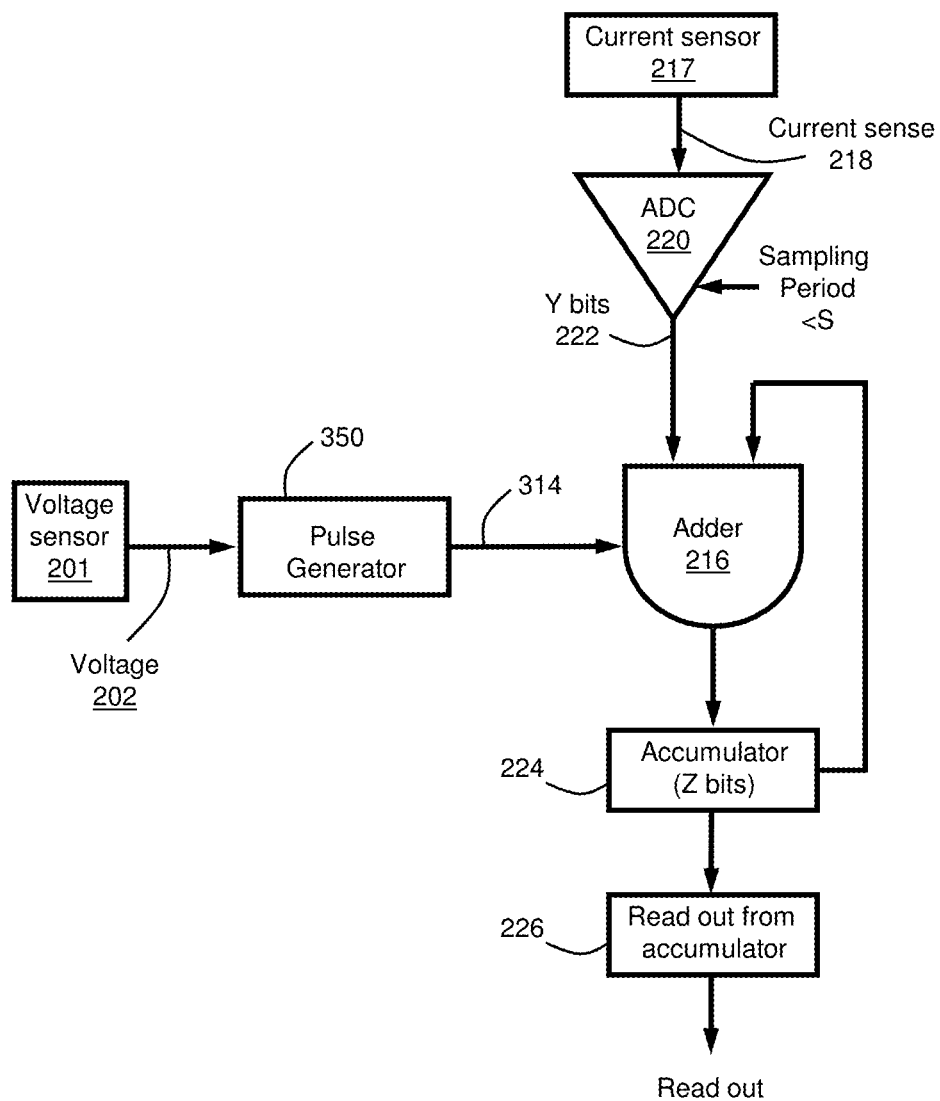
FIG. 3 illustrates an example of a second energy measurement circuit.

FIG. 3 illustrates circuit 300 in accordance with the present disclosure. Subcircuit 250 of circuit 200 has been replaced by pulse generator 350 in circuit 300. Pulse generator 350 may be capable of generating a variable-period pulse or timing signal 314, such that the pulse or timing signal 314 may be controlled by voltage 202. Pulse generator 350 may be, for example, a voltage controlled oscillator ("VCO") or a pulse generator having a voltage-controlled pulse repetition rate. The pulse generator may be configured to produce a signal having a pulse repetition rate that increases with increases in a control voltage such as voltage 202. A VCO or pulse generator may be realized by much simpler analog circuits than an analog multiplier.

Embodiments described herein provide a capability to report the energy, and not just the current, provided by a power supply unit. Embodiments are able to operate at high speed, capturing fast transients, and thus may be better able to eliminate averaging errors. Furthermore, during periods of time when the energy consumption is low (e.g., during sleep mode) embodiments are better able to provide a low rate of reading voltage and/or current, and communicating these readings to the power integration logic 145, power control logic 140, and/or power measurement logic 160 of FIG. 1.

Embodiments described herein provide a computationally simple accumulation of energy with the use of a digital accumulator, thereby eliminating the need for a multiplier. The digital accumulator may be a much lower-cost device to implement compared to a multiplier.

Embodiments described herein provide a capability to measure energy consumption relatively accurately and with a relatively simple circuit, compared to known methods or systems, by sampling a voltage supplied by a power source, and then sampling current supplied by the power source at a rate that is approximately proportional to the sampled voltage.

In some embodiments, circuit 200 and/or circuit 300 may be implemented by or within a controller, a processor, a control logic, or the like.

Figure 4:
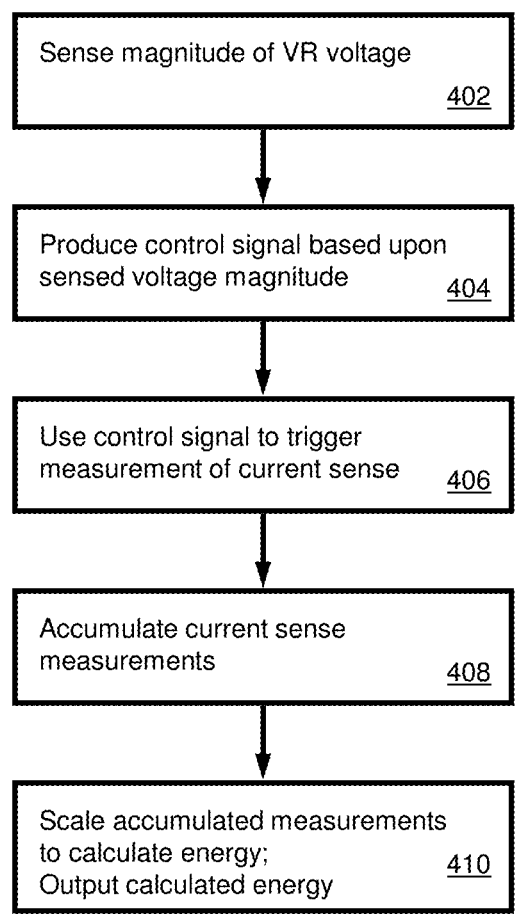
FIG. 4 illustrates an example of a process.

FIG. 4 illustrates a process 400 in accordance with an embodiment of the present disclosure. Process 400 begins at block 402, at which the magnitude of the analog voltage supplied by the VR may be sensed. Next, at block 404, a control signal based upon the sensed voltage magnitude may be produced. For example, the control signal may be a repetitive signal having a period or repetition rate or delay between repetitions that varies roughly proportionally to the magnitude of the sensed voltage.

Next, at block 406, the control signal may be used to trigger or gate a measurement of a current-sense signal. Next, at block 408, the measurement of the current-sense signal may be accumulated. Next, at block 410, the accumulated measurement of the current-sense signal may be scaled and outputted to produce an indication of the energy delivered by the power supply unit.

In some embodiments of a method, the control signal at block 404 may be produced by digitizing the analog voltage by use of an analog-to-digital converter ("ADC") at a sampling rate "S" into an X-bit binary digital representation. The voltage sample should be scaled by the ADC such that the maximum expected voltage does not overflow the X-bit binary digital representation. The X-bit binary digital representation may be stored in an X-bit binary digital accumulator, and the accumulator value increases each time the voltage is sampled. An overflow indicator (e.g., a carry bit) may be used as the control signal to trigger a measurement of the current-sense signal.

In some embodiments of a method, the control signal at block 404 may be produced by a VCO or PWM. Each cycle or pulse from the VCO or PWM, respectively, will be used as the control signal to trigger a measurement of the current-sense signal. When the voltage is high, cycles or pulses are produced at a higher rate relative to when the voltage is low.

Figure 5:
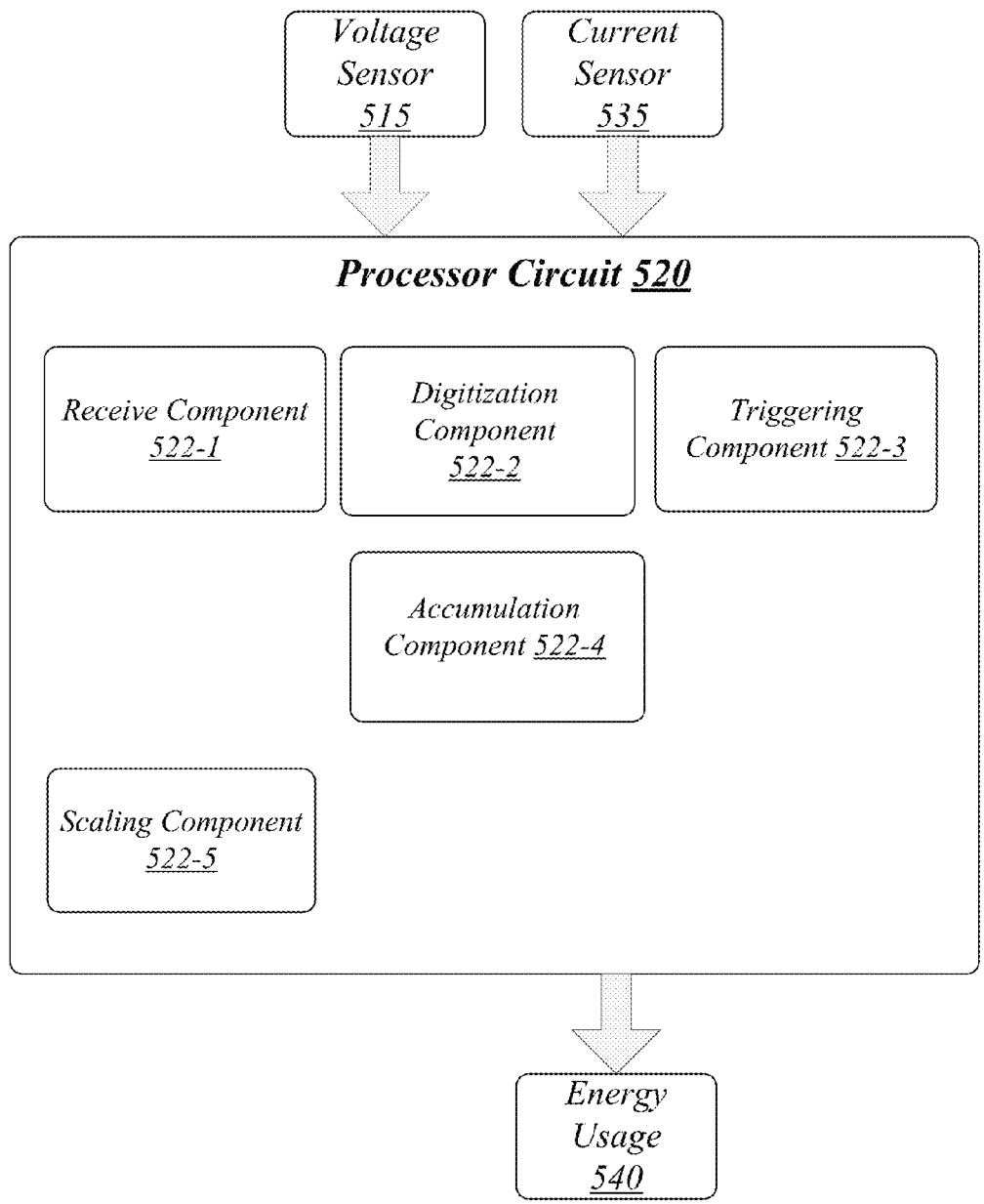
FIG. 5 illustrates an example block diagram for a first apparatus.

FIG. 5 illustrates a block diagram for a first apparatus. As shown in FIG. 5, the first apparatus includes an apparatus 500. Although apparatus 500 shown in FIG. 5 has a limited number of elements in a certain topology or configuration, it may be appreciated that apparatus 500 may include more or less elements in alternate configurations as desired for a given implementation.

The apparatus 500 may comprise a computer and/or firmware implemented apparatus 500 having a processor circuit 520 arranged to execute one or more components 522-*a*. It is worthy to note that "a" and "b" and "c" and similar designators as used herein are intended to be variables representing any positive integer. Thus, for example, if an implementation sets a value for a=5, then a complete set of components 522-*a* may include modules 522-1, 522-2, 522-3, 522-4 or 522-5. The embodiments are not limited in this context.

According to some examples, apparatus 500 may be part of a mobile device that may be capable of operating by battery power, for example a mobile computing device or a wireless phone.

In some examples, as shown in FIG. 5, apparatus 500 includes processor circuit 520. Processor circuit 520 may be generally arranged to execute one or more components 522-*a*. The processor circuit 520 can be any of various commercially available processors, including without limitation an AMD® Athlon®, Duron® and Opteron® processors; ARM® application, embedded and secure processors; IBM® and Motorola® DragonBall® and PowerPC® processors; IBM and Sony® Cell processors; Qualcomm® Snapdragon®; Intel® Celeron®, Core (2) Duo®, Core i3, Core i5, Core i7, Itanium®, Pentium®, Xeon®, Atom® and XScale® processors; and similar processors. Dual microprocessors, multi-core processors, and other multi-processor architectures may also be employed as processor circuit 520. According to some examples processor circuit 520 may also be an application specific integrated circuit (ASIC) and components 522-*a* may be implemented as hardware elements of the ASIC.

According to some examples, apparatus 500 may include a receive component 522-1. Receive component 522-1 may be executed by processor circuit 520 to receive voltage sense measurements from voltage sensor 515, current sense measurements from current sensor 535, and/or status information about processor circuit 920. Examples of status information may include processor utilization, operating mode, other sensor inputs, and so forth.

In some examples, apparatus 500 may also include a digitization component 522-2. Digitization component 522-2 may be executed by processor circuit 520 to digitize analog information such as voltage sense measurements from voltage sensor 515 and/or current sense measurements from current sensor 535.

In some examples, apparatus 500 may also include an accumulation component 522-4. Accumulation component 522-4 may be executed by processor circuit 520 to accumulate sampled values of voltage sense measurements from voltage sensor 515 and/or current sense measurements from current sensor 535. Information associated with accumulate sampled values of voltage sense measurements from voltage sensor 515 and/or current sense measurements from current sensor 535 may then be used to determine an amount of energy delivered by the power supply unit.

In some examples, apparatus 500 may also include a triggering component 522-3. Triggering component 522-3 may cause or trigger the sampling of voltage sense measurements from voltage sensor 515 and/or current sense measurements from current sensor 535.

According to some examples, apparatus 500 may also include a scaling component 522-5. Scaling component 522-5 may be executed by processor circuit 520 to scale the accumulated sampled values of voltage sense measurements from voltage sensor 515 and/or current sense measurements from current sensor 535 into units of measure that are relevant to a calculation of energy delivered (e.g., volts, amperes, or joules).

Figure 6:
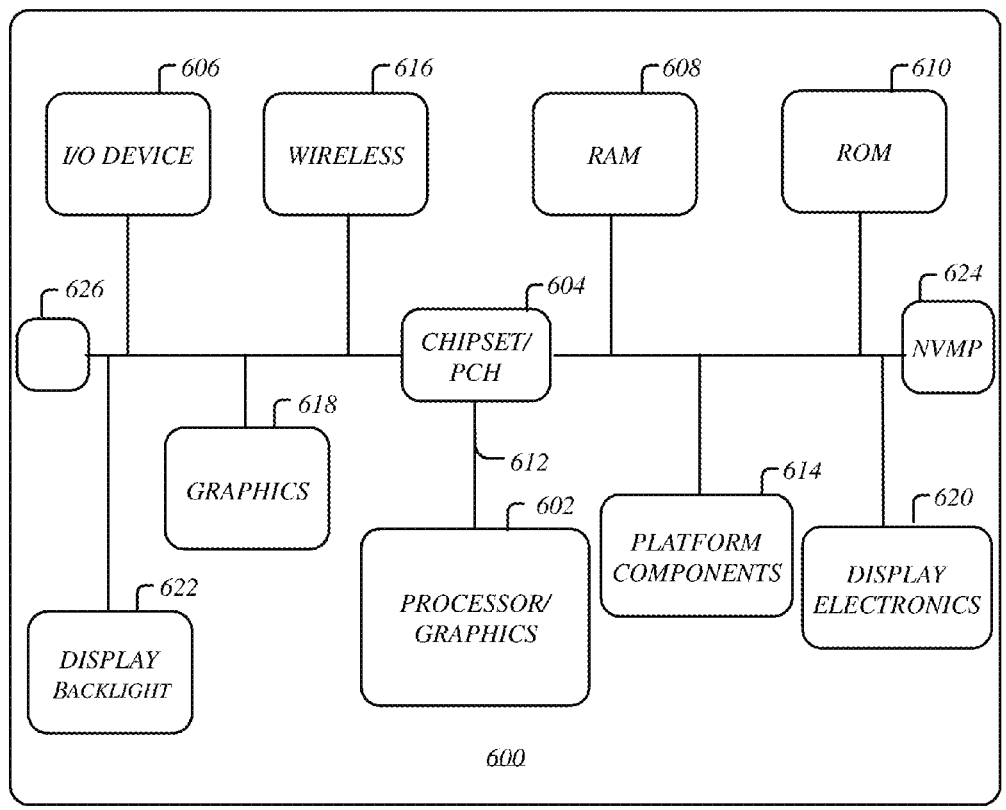
FIG. 6 is a diagram of an exemplary system embodiment.

FIG. 6 is a diagram of an exemplary system embodiment and in particular, FIG. 6 is a diagram showing a platform 600, which may include various elements. For instance, FIG. 6 shows that platform (system) 600 may include a processor/graphics core 602, a chipset/platform control hub (PCH) 604, an input/output (I/O) device 606, a random access memory (RAM) (such as dynamic RAM (DRAM)) 608, and a read only memory (ROM) 610, display electronics 620, display backlight 622, and various other platform components 614 (e.g., a fan, a crossflow blower, a heat sink, DTM system, cooling system, housing, vents, and so forth). System 600 may also include wireless communications chip 616 and graphics device 618. The embodiments, however, are not limited to these elements.

As shown in FIG. 6, I/O device 606, RAM 608, and ROM 610 are coupled to processor 602 by way of chipset 604. Chipset 604 may be coupled to processor 602 by a bus 612. Accordingly, bus 612 may include multiple lines.

Processor 602 may be a central processing unit comprising one or more processor cores and may include any number of processors having any number of processor cores. The processor 602 may include any type of processing unit, such as, for example, CPU, multi-processing unit, a reduced instruction set computer (RISC), a processor that have a pipeline, a complex instruction set computer (CISC), digital signal processor (DSP), and so forth. In some embodiments, processor 602 may be multiple separate processors located on separate integrated circuit chips. In some embodiments processor 602 may be a processor having integrated graphics, while in other embodiments processor 602 may be a graphics core or cores. Processor 602 may be adapted to include or perform embodiments described herein.

Included herein is a set of logic flows representative of example methodologies for performing novel aspects of the disclosed architecture. While, for purposes of simplicity of explanation, the one or more methodologies shown herein are shown and described as a series of acts, those skilled in the art will understand and appreciate that the methodologies are not limited by the order of acts. Some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all acts illustrated in a methodology may be required for a novel implementation.

A logic flow may be implemented in software, firmware, and/or hardware. In software and firmware embodiments, a logic flow may be implemented by computer executable instructions stored on at least one non-transitory computer readable medium or machine readable medium, such as an optical, magnetic or semiconductor storage. The embodiments are not limited in this context.

Some examples may be described using the expression "in one example" or "an example" along with their derivatives. These terms mean that a particular feature, structure, or characteristic described in connection with the example is included in at least one example. The appearances of the phrase "in one example" in various places in the specification are not necessarily all referring to the same example.

Some examples may be described using the expression "coupled", "connected", or "capable of being coupled" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The following examples pertain to further embodiments.

Example 1 is an apparatus that includes a current sensor to provide a first voltage that indicates a current delivered by an energy source; a voltage sensor to provide a second voltage that indicates voltage measurement of a voltage associated with the current delivered by the energy source; and a controller comprising logic, at least a portion of which is in hardware, the controller to digitize the first voltage, and to accumulate the digitized first voltage when triggered by a signal based upon the second voltage, and to scale an accumulation of digitized first voltages into a measurement of energy.

In example 2, the controller of example 1 digitizes the second voltage.

In example 3 the controller of example 2 digitizes at a periodic rate from about 1.0 GHz to about 5.0 GHz.

In example 4, the controller of example 2 digitizes at a periodic rate that is responsive to an operating mode of the apparatus.

In example 5, the controller of example 2 accumulates digitized second voltages using a voltage measurement accumulator, and to trigger accumulation of the digitized first voltage, using a current measurement accumulator, based upon an overflow indicator provided by the voltage measurement accumulator.

In example 6, the controller of any of examples 1-5 further includes a voltage controlled oscillator (VCO), the VCO produces a periodic signal having a repetition rate that increases with an increase in the voltage associated with the current delivered by the energy source.

In example 7, the controller of any of examples 1-6 further includes a variable-period pulse generator, the pulse generator produces a periodic signal having a repetition rate that increases with an increase in the voltage associated with the current delivered by the energy source.

In example 8, the controller of any of examples 1-7, the measurement of energy is to estimate a remaining battery life.

In example 9, at least one computer-readable storage medium includes instructions that, when executed, cause a controller to: receive a first indicator of a current sense signal and a second indicator of an associated voltage sense signal that are derived from an output of the power supply unit; trigger digitization of a measurement of the first indicator to produce a digitized first indicator measurement; trigger an accumulation of the digitized first indicator measurement to produce an accumulated first indicator measurement; and scale the accumulated first indicator measurement into a measurement of energy.

In example 10, the at least one computer-readable storage medium of example 9 optionally includes instructions that, when executed, cause a controller to digitize at a periodic rate between about 1.0 GHz to about 5.0 GHz.

In example 11, the at least one computer-readable storage medium of any of examples 9-10 optionally includes instructions that, when executed, cause a controller to digitize at a periodic rate that is responsive to an operating mode of an apparatus powered by the power supply unit.

In example 12, the at least one computer-readable storage medium of any of examples 9-11 optionally includes instructions that, when executed, cause a controller to digitize a measurement of the voltage sense signal.

In example 13, the at least one computer-readable storage medium of any of examples 9-12 optionally includes instructions that, when executed, cause a controller to accumulate digitized measurements of the voltage sense signal and to provide an overflow indicator that is usable as a trigger.

In example 14, the at least one computer-readable storage medium of any of examples 9-13 optionally includes instructions that, when executed, cause a controller to trigger by use of a periodic signal from a voltage controlled oscillator (VCO), having a repetition rate that increases with an increase in the voltage of the voltage sense signal.

In example 15, the at least one computer-readable storage medium of any of examples 9-14 optionally includes instructions that, when executed, cause a controller to trigger by use of a periodic signal from a variable-period pulse generator, having a repetition rate that increases with an increase in the voltage of the voltage sense signal.

In example 16, the at least one computer-readable storage medium of any of examples 9-15, the measurement of energy is to estimate a remaining battery life.

Example 17 is a system that includes a current sensor to provide a first voltage that indicates a current delivered by an energy source; a processor to consume energy produced by the energy source; a memory coupled to the processor, the memory configured to store data; a voltage sensor to provide a second voltage that indicates voltage measurement of a voltage associated with the current delivered by the energy source; a first analog-to-digital converter (ADC) to digitize the first voltage and produce digitized first voltages; and a control logic to accumulate in a first accumulator the digitized first voltage when triggered by a signal based upon the second voltage, and to scale an accumulation of digitized first voltages into a measurement of energy.

In example 18, the processor of examples 17 further comprising a second ADC to digitize the second voltage and produce digitized second voltages.

In example 19, the second ADC of example 18 digitizes at a periodic rate from about 1.0 GHz to about 5.0 GHz.

In example 20, the second ADC of example 18 digitizes at a periodic rate that is responsive to an operating mode of the apparatus.

In example 21, the control logic of any of examples 17-20 accumulates in a second accumulator digitized measurements of the second voltage, and triggers accumulation in the first accumulator of the digitized first voltage based upon an overflow indicator provided by the second accumulator.

In example 22, the control logic of any of examples 17-21 further includes a voltage controlled oscillator (VCO), the VCO produces a periodic signal having a repetition rate that increases with an increase in the second voltage.

In example 23, the control logic of example 22 further accumulates in a second accumulator digitized measurements of the second voltage, and to trigger accumulation in the first accumulator of the digitized first voltage based upon the periodic signal from the VCO.

In example 24, the control logic of any of examples 17-23 further includes a variable-period pulse generator, the variable-period pulse generator produces a periodic signal having a repetition rate that increases with an increase in the voltage of the voltage sense signal.

In example 25, the control logic of example 24 further accumulates in a second accumulator digitized measurements of the second voltage, and to trigger accumulation in the first accumulator of the digitized first voltage based upon the periodic signal from the variable-period pulse generator.

In example 26, the system of any of examples 17-25 wherein the measurement of energy is to estimate a remaining battery life.

Example 27 is an apparatus that includes a means for sensing a first voltage that indicates a current delivered by an energy source; a means for sensing a second voltage that indicates voltage measurement of a voltage associated with the current delivered by the energy source; a means for digitizing the first voltage; a means for accumulating the digitized first voltage when triggered by a signal based upon the second voltage; and a means for scaling an accumulation of digitized first voltages into a measurement of energy.

In example 28, the apparatus of example 27 includes a means for digitizing the second voltage.

In example 29 the apparatus of example 28 includes a means for digitizing at a periodic rate from about 1.0 GHz to about 5.0 GHz.

In example 30, the apparatus of example 28 includes a means for digitizing at a periodic rate that is responsive to an operating mode of the apparatus.

In example 31, the apparatus of any of examples 28-30 includes a means for accumulating digitized second voltages using a voltage measurement accumulator, and a means for triggering accumulation of the digitized first voltage, using a current measurement accumulator, based upon an overflow indicator provided by the voltage measurement accumulator.

In example 32, the apparatus of any of examples 28-31 further includes a means for generating a variable-period periodic signal having a period that increases with an increase in the voltage associated with the current delivered by the energy source.

In example 33, the apparatus of any of examples 28-32, wherein the measurement of energy is to estimate a remaining battery life.

Example 34 is a method that includes sensing a first voltage that indicates a current delivered by an energy source; sensing a second voltage that indicates voltage measurement of a voltage associated with the current delivered by the energy source; digitizing the first voltage; accumulating the digitized first voltage when triggered by a signal based upon the second voltage; and scaling an accumulation of digitized first voltages into a measurement of energy.

In example 35, the method of example 34 includes digitizing the second voltage.

In example 36 the method of example 35 includes digitizing at a periodic rate from about 1.0 GHz to about 5.0 GHz.

In example 37, the method of example 35 includes digitizing at a periodic rate that is responsive to an operating mode of an apparatus.

In example 38, the method of any of examples 34-37 includes accumulating digitized second voltages using a voltage measurement accumulator, and triggering accumulation of the digitized first voltage, using a current measurement accumulator, based upon an overflow indicator provided by the voltage measurement accumulator.

In example 39, the method of any of examples 34-38 further includes generating a variable-period periodic signal having a period that increases with an increase in the voltage associated with the current delivered by the energy source.

In example 40, the method of any of examples 34-39, wherein the measurement of energy is to estimate a remaining battery life.

It is emphasized that the Abstract of the Disclosure is provided to comply with 37 C.F.R. Section 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single example for the purpose of streamlining the disclosure. This method of disclosure is not to be interpreted as reflecting an intention that the claimed examples require more features than are expressly recited in each claim. Rather, as the following claims reflect, inventive subject matter lies in less than all features of a single disclosed example. Thus the following claims are hereby incorporated into the Detailed Description, with each claim standing on its own as a separate example. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

What is claimed is:

1. An apparatus comprising:
   a current sensor to provide a first voltage that indicates a current delivered by an energy source;
   a first analog to digital converter (ADC) operably coupled to the current sensor, the ADC to digitize the first voltage;
   a voltage sensor to provide a second voltage that indicates voltage measurement of a voltage associated with the current delivered by the energy source;
   a first accumulator operably coupled to the first ADC and the voltage sensor, the first accumulator to accumulate the digitized first voltage based upon the second voltage to represent a measurement of energy;
   a second ADC operably coupled to the voltage sensor to digitize the second voltage; and
   a second accumulator operably coupled to the second ADC, the second accumulator to accumulate the digitized second voltages, the first accumulator operably coupled to the second accumulator and accumulate the digitized first voltage based on an overflow indicator provided by the second accumulator.

2. The apparatus of claim 1, the second ADC to digitize the second voltage at a periodic rate from about 1.0 GHz to about 5.0 GHz.

3. The apparatus of claim 1, the second ADC to digitize the second voltage at a periodic rate that is responsive to an operating mode of the apparatus.

4. The apparatus of claim 1, comprising a pulse generator operably coupled to the voltage sensor and the first accumulator, the pulse generator to produce a periodic signal having a repetition rate that increases with an increase in the second voltage, the first accumulator to accumulate the digitized first voltage based upon the periodic signal.

5. The apparatus of claim 4, the pulse generator a voltage controlled oscillator (VCO).

6. The apparatus of claim 1, wherein the measurement of energy is to estimate a remaining battery life.

7. At least one non-transitory computer-readable storage medium comprising instructions that, when executed, cause a processor to:
   receive, from a current sensor, a first indicator of a current delivered by a power supply;
   receive, from a voltage sensor, a second indicator of a voltage associated with the current delivered by the power supply;
   send a first control signal to a first analog to digital converter (ADC) to trigger digitization of a measurement of the first indicator to produce a digitized first indicator measurement;
   send a second control signal to a first accumulator to trigger an accumulation of the digitized first indicator measurement to produce an accumulated first indicator measurement to represent a measurement of energy, the second control signal based in part on the second indicator;
   send a third control signal to a second ADC to trigger digitization of a measurement of the second indicator; and
   send a fourth control signal to a second accumulator to trigger an accumulation of the digitized measurements of the second indicator and to provide an overflow indicator, the second control signal based in part on the overflow indicator.

8. The at least one non-transitory computer-readable storage medium of claim 7, comprising instructions that, when executed, cause the processor to send the first control signal to trigger digitization at a periodic rate between about 1.0 GHz to about 5.0 GHz.

9. The at least one non-transitory computer-readable storage medium of claim 7, comprising instructions that, when executed, cause the processor to:
   send a third control signal to a second ADC to trigger digitization of a measurement of the second indicator; and
   send a fourth control signal to a second accumulator to trigger an accumulation of the digitized measurements of the second indicator and to provide an overflow indicator, the second control signal based in part on the overflow indicator.

10. The at least one non-transitory computer-readable storage medium of claim 7, comprising instructions that, when executed, cause the processor to send a control signal to a second ADC to trigger digitization of a measurement of the second indicator based on a periodic signal received from a pulse generator, the pulse generator to produce the periodic signal having a repetition rate that increases with an increase in the voltage associated with the current delivered by the power supply.

11. The at least one non-transitory computer-readable storage medium of claim 10, the pulse generator a voltage controlled oscillator (VCO).

12. The at least one non-transitory computer-readable storage medium of claim 7, wherein the measurement of energy is to estimate a remaining battery life.

13. A system comprising:
   a current sensor to provide a first voltage that indicates a current delivered by an energy source;
   a processor to consume energy produced by the energy source;
   a memory coupled to the processor, the memory configured to store data;
   a voltage sensor to provide a second voltage that indicates voltage measurement of a voltage associated with the current delivered by the energy source;
   a first analog-to-digital converter (ADC) operably coupled to the current sensor, the first ADC to digitize the first voltage and produce digitized first voltages;
   a first accumulator operably coupled to the first ADC and the voltage sensor, the first accumulator to accumulate the digitized first voltage based in part upon the second voltage to represent a measurement of energy; and a pulse generator operably coupled to the voltage sensor and the first accumulator, the pulse generator to produce a periodic signal having a repetition rate that increases with an increase in the second voltage, the first accumulator to accumulate the digitized first voltage based upon the periodic signal.

14. The system of claim 13, comprising a second ADC operably coupled to the voltage sensor, the second ADC to digitize the second voltage and produce digitized second voltages.

15. The system of claim 14, the second ADC to digitize at a periodic rate from about 1.0 GHz to about 5.0 GHz.

16. The system of claim 14, the second ADC to digitize at a periodic rate that is responsive to an operating mode of the apparatus.

17. The system of claim 14, comprising a second accumulator operably coupled to the second ADC, the second accumulator to accumulate the digitized measurements of the second voltage and to trigger accumulation in the first accumulator of the digitized first voltage based upon an overflow indicator provided by the second accumulator.

18. The system of claim 13, the pulse generator to produce a periodic signal having a repetition rate that increases with an increase in the second voltage.

19. The system of claim 18, the first accumulator digitized first voltage based upon the periodic signal.

20. The system of claim 13, wherein the measurement of energy is to estimate a remaining battery life.

21. The system of claim 13, the pulse generator a voltage controlled oscillator (VCO).

* * * * *